(12) United States Patent
Patel et al.

(10) Patent No.: US 10,103,692 B2
(45) Date of Patent: Oct. 16, 2018

(54) VAPOR CHAMBER AMPLIFIER MODULE

(71) Applicant: CommScope Technologies LLC, Hickory, NC (US)

(72) Inventors: Sammit A. Patel, Dallas, TX (US); Yongjie Xu, Shanghai (CN); Qiyun Gu, Shanghai (CN); Richard W. Brown, Forest, VA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/312,717

(22) PCT Filed: Apr. 29, 2015

(86) PCT No.: PCT/US2015/028237
§ 371 (c)(1),
(2) Date: Nov. 21, 2016

(87) PCT Pub. No.: WO2015/179089
PCT Pub. Date: Nov. 26, 2015

(65) Prior Publication Data
US 2017/0230011 A1 Aug. 10, 2017

Related U.S. Application Data

(60) Provisional application No. 62/001,773, filed on May 22, 2014.

(51) Int. Cl.
| | |
|---|---|
| *H03F 1/30* | (2006.01) |
| *H05K 7/20* | (2006.01) |
| *H01L 23/427* | (2006.01) |
| *H05K 3/34* | (2006.01) |
| *H05K 1/18* | (2006.01) |
| *H03F 3/213* | (2006.01) |

(Continued)

(52) U.S. Cl.
CPC ......... *H03F 1/301* (2013.01); *H01L 23/4006* (2013.01); *H01L 23/427* (2013.01);
(Continued)

(58) Field of Classification Search
CPC ............ H05K 7/2029; H05K 7/20336; H05K 7/20936; H05K 1/0204; H05K 1/021; H01L 23/427; H03F 2200/447
(Continued)

(56) References Cited

U.S. PATENT DOCUMENTS

| | | | |
|---|---|---|---|
| 5,355,942 A | 10/1994 | Conte | |
| 6,235,991 B1 * | 5/2001 | Johnson | H05K 3/0061 174/138 D |

(Continued)

FOREIGN PATENT DOCUMENTS

CN 101765352 A 6/2010

OTHER PUBLICATIONS

Notification of Transmittal of International Preliminary Report on Patentability (Chapter I of the Patent Cooperation Treaty) International Application No. PCT/US2015/028237; dated Dec. 1, 2016; 8 Pages.

*Primary Examiner* — Zachary M Pape
(74) *Attorney, Agent, or Firm* — Myers Bigel, P.A.

(57) ABSTRACT

In one embodiment, an electronic system includes a printed circuit board, one or more packaged semiconductor devices, and a vapor chamber having a top and a bottom and enclosing a sealed cavity that is partially filled with a coolant. The vapor chamber comprises a thermo-conductive and electro-conductive material. The top of the vapor chamber has one or more depressions formed therein, each depression receiving and thermo-conductively connected to at least part of a bottom of a corresponding packaged semiconductor device, which is mounted through a corresponding aperture in the PCB. A heat sink may be thermo-conductively attached to the bottom of the vapor chamber.

14 Claims, 4 Drawing Sheets

(51) Int. Cl.
*H01L 23/66* (2006.01)
*H05K 1/02* (2006.01)
*H01L 23/40* (2006.01)
*H01L 29/78* (2006.01)

(52) U.S. Cl.
CPC ............ *H01L 23/66* (2013.01); *H03F 3/213* (2013.01); *H05K 1/0203* (2013.01); *H05K 1/183* (2013.01); *H05K 3/3421* (2013.01); *H05K 3/3463* (2013.01); *H01L 29/7816* (2013.01); *H01L 2023/4031* (2013.01); *H01L 2023/4062* (2013.01); *H01L 2023/4087* (2013.01); *H01L 2223/6644* (2013.01); *H03F 2200/411* (2013.01); *H03F 2200/447* (2013.01); *H03F 2200/451* (2013.01); *H05K 7/20336* (2013.01); *H05K 7/20936* (2013.01); *H05K 2201/064* (2013.01); *H05K 2201/09036* (2013.01); *H05K 2201/09063* (2013.01); *H05K 2201/10166* (2013.01)

(58) Field of Classification Search
USPC .................. 361/700; 165/80.4–80.5, 104.33; 174/15.2; 257/715
See application file for complete search history.

(56) References Cited

U.S. PATENT DOCUMENTS

| | | | | |
|---|---|---|---|---|
| 6,276,593 | B1* | 8/2001 | Artaki | H05K 1/021 228/180.21 |
| 6,292,374 | B1* | 9/2001 | Johnson | H05K 1/0204 174/252 |
| 6,421,253 | B1* | 7/2002 | Ash, Jr. | H05K 1/021 29/831 |
| 6,842,341 | B1* | 1/2005 | Waldvogel | H05K 1/021 257/706 |
| 7,342,306 | B2* | 3/2008 | Colbert | H01L 23/3672 257/712 |
| 7,342,788 | B2* | 3/2008 | Nikfar | F28D 15/0233 165/104.33 |
| 8,995,933 | B2* | 3/2015 | Waldvogel | H04B 1/40 361/688 |
| 2008/0266885 | A1* | 10/2008 | Sun | F21V 29/004 362/373 |
| 2011/0232877 | A1* | 9/2011 | Meyer, IV | F28D 15/0266 165/104.26 |
| 2013/0043000 | A1 | 2/2013 | Wang | |
| 2016/0341486 | A1* | 11/2016 | Kim | F28D 15/046 |

* cited by examiner

VAPOR CHAMBER AMPLIFIER MODULE

This application claims the benefit of the filing date of U.S. Provisional Application No. 62/001,773 filed on May 22, 2014, the teachings of which are incorporated herein by reference in their entirety.

BACKGROUND

The current disclosure relates to electronics, and more specifically but not exclusively, to heat dissipation for active semiconductor devices.

Wireless communication systems may include base stations that transmit electromagnetic (EM) signals. The base station transmitters employ radio-frequency (RF) power amplifiers to amplify RF EM signals for transmission. RF power amplifiers are active semiconductor-based devices that may employ any of various different technologies to achieve amplification, e.g., LDMOS (laterally diffused metal oxide semiconductor), GaN, or GaAs. Typically, a base-station transmitter comprises a series of amplification stages—which may be referred to as a lineup—that increases in power level from lower-level amplification to higher-level amplification. A final-stage RF power amplifier typically generates more heat than an earlier-stage RF power amplifier. A lineup of RF power amplifiers comprising final-stage and/or pre-final-stage power amplifiers may be mounted onto a printed circuit board (PCB) that comprises additional electronic components.

Figure 1A:
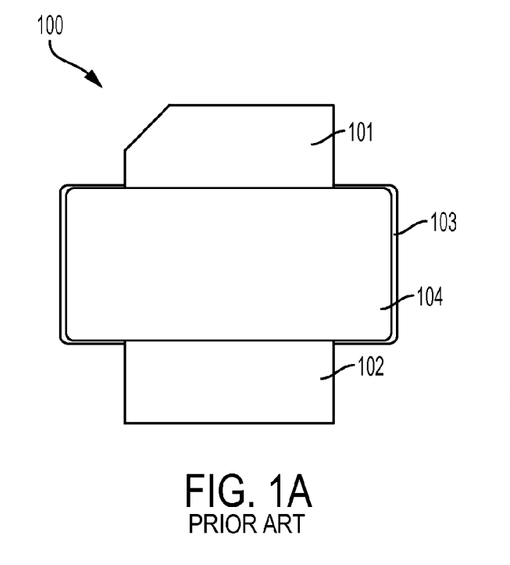
FIG. 1A is a first orthogonal view of an amplifier device.
Figure 1B:
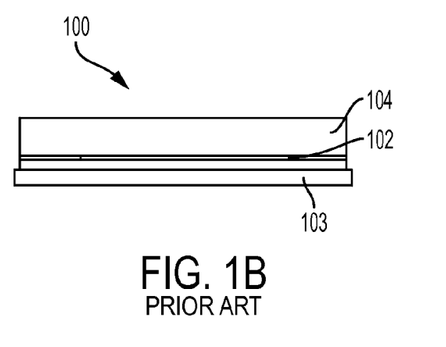
FIG. 1B is a second orthogonal view of the amplifier device of FIG. 1A.
Figure 1C:
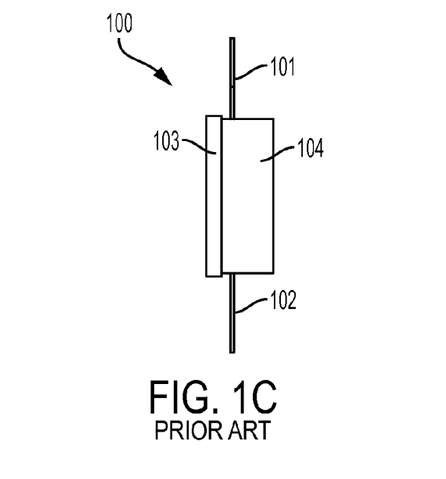
FIG. 1C is a third orthogonal view of the amplifier device of FIG. 1A.
Figure 1D:
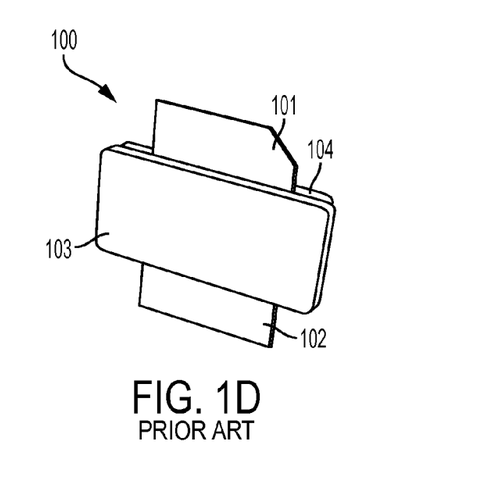
FIG. 1D is a perspective view of the amplifier device of FIG. 1A.

FIGS. 1A-1D show various views of exemplary conventional packaged RF power amplifier device 100. FIG. 1A is a first orthogonal view of amplifier device 100. FIG. 1B is a second orthogonal view of amplifier device 100 of FIG. 1A. FIG. 1C is a third orthogonal view of amplifier device 100 of FIG. 1A. FIG. 1D is a perspective view of amplifier device 100 of FIG. 1A. Amplifier device 100 is packaged in an earless flanged LDMOS package.

Specifically, amplifier device 100 comprises drain lead 101, gate lead 102, source lead 103, and encapsulant 104. Drain lead 101 and gate lead 102 are in the form of fins. Source lead 103 forms the earless flange of amplifier device 100 and may be referred to as flange 103. Note that LDMOS packages with eared flanges (not shown) have flanges that extend further out to the sides, where the extensions may have slots or holes for screws or similar attachment means. Also note that LDMOS packages with earless flanges are sometimes referred to elsewhere as flangeless packages. Encapsulant 104 may comprise, for example, ceramic and/or epoxy. Amplifier device 100 also comprises a semiconductor die that is encapsulated by encapsulant 104 and not visible in FIGS. 1A-1D.

The semiconductor die comprises a power transistor whose terminals are conductively connected to the corresponding external leads. In other words, the power transistor's drain, source, and gate terminals are conductively connected to drain lead 101, source lead 103, and gate lead 102, respectively. The transistor may also have a bulk-semiconductor terminal that is conductively connected to source lead 103. Note that the transistor may be a compound transistor where a plurality of smaller individual transistors are connected together so as to function like a single larger transistor. The leads 101, 102, and 103 are metallic—e.g., copper. Most of the heat generated by amplifier device 100 is dissipated through flange 103, which has relatively large surface area.

RF power amplifiers tend to generate a considerable amount of heat, where a higher power level generally correlates with more heat generated. Heat generated by RF power amplifiers needs to be dissipated to prevent device failure and in order to extend the operational life of the RF power amplifiers and/or nearby components. Conventional means of heat dissipation include the attachment of a finned heat sink to the RF power amplifier.

Figure 2:
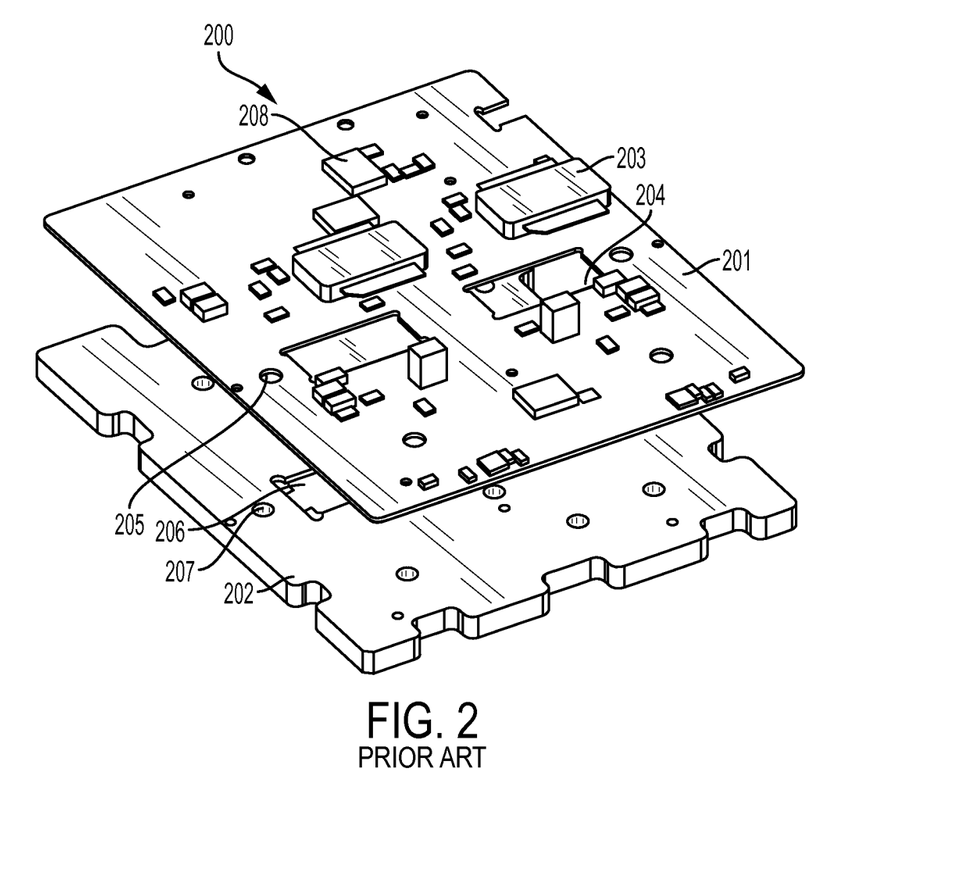
FIG. 2 is a simplified exploded perspective view of an exemplary conventional RF power amplifier system.

FIG. 2 is a simplified exploded perspective view of exemplary conventional RF power amplifier system 200. System 200 includes PCB 201, metal pallet 202, and two RF power amplifier devices 203, which each may be substantially similar to amplifier device 100 of FIGS. 1A-1D. PCB 201 has two apertures 204 for the two corresponding amplifier devices 203 and holes 205 for corresponding screws (not shown). Metal pallet 202 is a bulk metal plate comprising, for example, copper or aluminum. Pallet 202 has two depressions 206 for the bottom surfaces of the flanges of the two amplifier devices 203 and holes 207 for the above-mentioned corresponding screws.

Amplifier devices 203 are mounted onto PCB 201, where the drain, gate, and source leads of the amplifier devices 203 are electrically connected to corresponding contacts (not shown) on PCB 201. The flanges of the amplifier devices 203, which correspond to the source leads, are inserted through corresponding apertures 204 in the PCB 201 and into corresponding depressions 206 on pallet 202. PCB 201 also has mounted thereon additional components 208. Components 208 and amplifier devices 203 are electrically interconnected via traces (not shown) on PCB 201.

System 200 may further include a heat sink (not shown) whose top attaches to the bottom of pallet 202. The heat sink comprises, on the top, a bulk metal plate and, on the bottom, an array of metallic fins extending out from the bulk metal plate. The top of the heat sink may include screw holes for the above-mentioned corresponding screws for attachment to pallet 202 and PCB 201. A solid thermal medium or thermal grease (not shown) may also be applied between the pallet 202 and the heat sink to help facilitate proper thermal transfer between the mating surfaces.

Metals are relatively efficient heat conductors and a conventional heat sink conducts heat from the heat-generating device to the medium surrounding the fins—which is typically air—thereby effectively increasing the heat-dissipating surface area of the heat-generating device. However, the heat-dissipating capabilities of the pallet and heat sink combination are limited and, as result, the amplifier devices 100 may need to be spaced relatively far apart from each other so that they are not damaged by excessive heat from neighboring amplifier devices 100. More-efficient means of dissipating heat from an active device would lower the device's temperature, help extend its life, and provide additional benefits.

SUMMARY

One embodiment of the disclosure can be an apparatus comprising a vapor chamber having a top and a bottom and enclosing a sealed cavity that is partially filled with a coolant. The vapor chamber comprises a thermo-conductive material. The top of the vapor chamber has at least one depression formed therein. The depression is adapted to receive and thermo-conductively connect to at least part of a bottom of a corresponding packaged semiconductor device mounted through a corresponding aperture in a corresponding printed circuit board (PCB).

Another embodiment of the disclosure can be a method for assembling an apparatus. The method comprises mounting a set of one or more packaged semiconductor devices onto a printed circuit board (PCB) and attaching the PCB to a vapor chamber. Each packaged semiconductor device of the set of one or more packaged semiconductor devices has a bottom and is mounted through a corresponding aperture in the PCB. The vapor chamber has a top and a bottom and encloses a sealed cavity that is partially filled with a coolant. The vapor chamber comprises a thermo-conductive material. The top has a set of one or more depressions formed therein corresponding to the set of one or more packaged semiconductor devices. Each depression is adapted to receive and thermo-conductively connect to at least part of the bottom of a corresponding packaged semiconductor device.

BRIEF DESCRIPTION OF THE DRAWINGS

Other embodiments of the invention will become apparent. In the accompanying drawings, like reference numerals identify similar or identical elements.

DETAILED DESCRIPTION

A vapor chamber is a sealed metal container that is partially filled with a coolant—which may also be referred to as a working fluid—and from which most air is removed. As a result, the pressure inside the vapor chamber may be significantly lower than atmospheric pressure. A vapor chamber functions like a heat pipe and may be considered to be a planar heat pipe. A vapor chamber is typically shaped substantially like a flat box on the outside. The interior surface of a vapor chamber includes a liquid-wicking structure such as, for example, sintered metal. A vapor chamber may additionally include internal support structures—e.g., columns—to prevent collapse of the vapor chamber.

In operation, a heat source on one side of a vapor chamber heats the coolant, which is initially liquid, so that the liquid evaporates. The coolant gas then travels to another side of the vapor chamber where it cools and condenses back to the liquid phase and, in the process, releases heat to that side. The liquid coolant then returns to the hot side via the wicking action of the wicking inner surface of the vapor chamber and the cycle repeats. Vapor chambers generally provide superior heat dissipation—and lighter weight—compared to bulk metal—or other solid—slugs of similar dimensions since vapor chambers dissipate more heat more uniformly than comparable slugs. Additional product weight, size, and cost reduction may be realized by using smaller and/or simpler heat sinks in conjunction with the more-efficient vapor chambers.

A vapor chamber is typically assembled from a top piece and a bottom piece that are brought together, whereupon the resulting chamber is both (i) filled with the coolant liquid and (ii) evacuated. The particular order and details of the steps may vary. For example, the top and bottom pieces may be brought together and mostly sealed, then—through the unsealed segment—filled with the coolant, then evacuated, and then fully sealed. Or the chamber may be evacuated before filling with the coolant. Or one or more of the steps—e.g., filling with coolant and/or attachment of top and bottom pieces—may be performed under vacuum, or near-vacuum, conditions. The top and bottom may be attached together by, for example, welding, pressing, and/or soldering.

Figure 3:
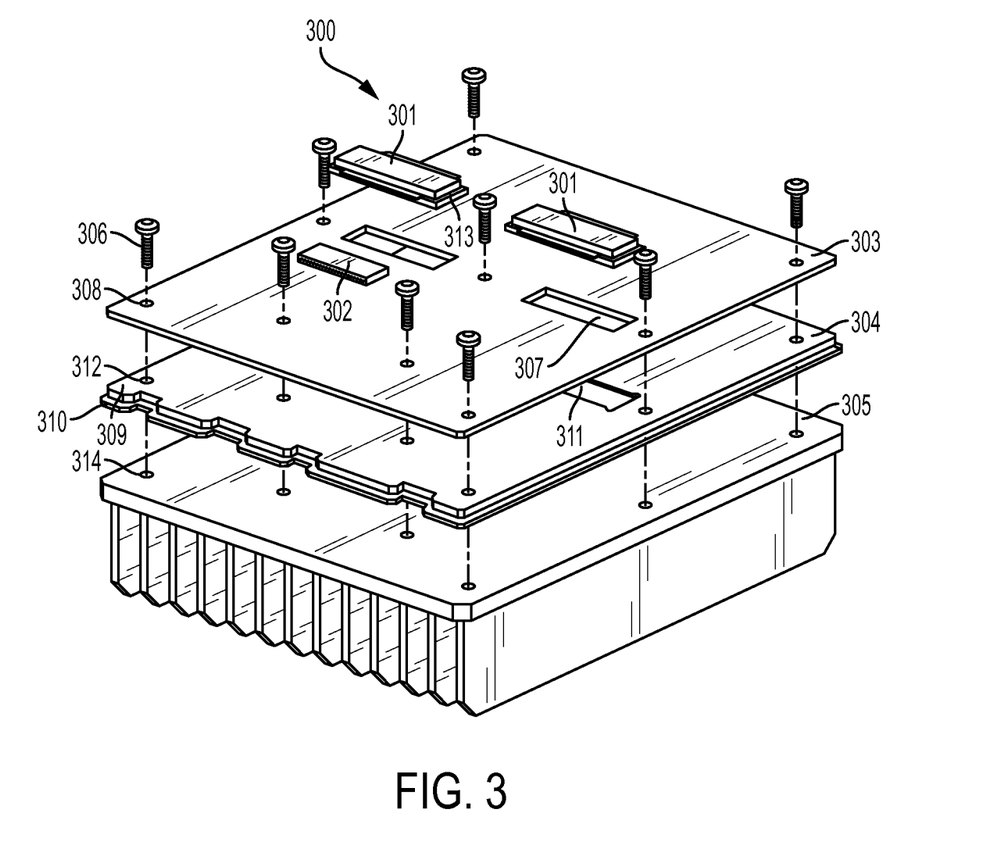
FIG. 3 is a simplified exploded perspective view of an exemplary vapor-chamber amplifier (VCA) system in accordance with one embodiment of the present invention.

FIG. 3 is a simplified exploded perspective view of exemplary vapor-chamber amplifier (VCA) system 300 in accordance with one embodiment of the present invention. VCA system 300 comprises two final-stage RF power amplifier devices 301, pre-final-stage RF power amplifier device 302, PCB 303, vapor chamber 304, heat sink 305, and screws 306. PCB 303 has two apertures 307 for the two corresponding final-stage RF power amplifier devices 301 and holes 308 for corresponding screws 306.

In VCA system 300, vapor chamber 304 is used instead of a conventional metal pallet. Vapor chamber 304 includes top piece 309 and bottom piece 310. Top piece 309 of vapor chamber 304 includes two depressions 311 for the two corresponding final-stage RF power amplifier devices 301 and holes 312 for corresponding screws 306. It should be noted that holes 312 do not provide an opening in or out of the coolant-holding cavity (not shown) of vapor chamber 304. In other words, holes 312 are walled cylinders akin to tunnels running the height of vapor chamber 304. Depressions 311 are shaped to receive the bottoms of flanges 313 of the corresponding amplifier devices 301. Note that depressions 311 may also be referred to as recesses. Heat sink 305 includes tapped screw holes 314 for corresponding screws 306.

Pre-final-stage RF power amplifier device 302 may be in any suitable package—such as, for example, a dual in-line package (DIP)—and is mounted on the top side of PCB 303 using any suitable mounting means, such as, for example, soldering or solder reflow. The two final-stage RF power amplifier devices 301 are packaged in LDMOS packages similar to amplifier device 100 of FIGS. 1A-1D and are mounted on the top side of PCB 303 using any suitable mounting means, such as, for example, soldering or solder reflow. The three RF power amplifier devices 302 and 301, as well as additional electrical components (not shown) mounted on PCB 303, may be electrically interconnected via conductive traces on or in PCB 303.

The gate and drain leads of power amplifier devices 301 are electrically connected to corresponding contacts (not shown) on the top surface of PCB 303. The apertures 307 of PCB 303 are shaped to admit the flanges 313 of the corresponding power amplifier devices 301. The flange 313 of each power amplifier device 301 is inserted through the corresponding aperture 307 in the PCB 303 and into the corresponding depression 311 of the vapor chamber 304 so that the bottom of the flange 313 is in thermo-conductive and electro-conductive contact with at least the bottom of the depression 311. A thermo-conductive contact is a contact adapted to conduct heat and may be direct or through a conductive material.

Preferably, in addition, a portion of the sides of the flange 313 is in conductive contact with a portion of the side walls of the recess 311 for increased contact area—and, consequently, increased thermal and electrical conductance—between the flange 313 and the corresponding recess 311. The flange 313 may be directly connected to a common— e.g., ground—terminal on the PCB 303 or may be conductively connected to a common terminal on the PCB 303 via the vapor chamber 304. Notably, the vapor chamber 304 may serve as a common—e.g., ground—path for all of the RF power amplifier devices 301 and the PCB 303. In other words, the vapor chamber 304 may provide a uniform path for ground currents to flow among the flanges 313 and the PCB 303.

PCB 303, vapor chamber 304, and heat sink 305 may be attached together using screws 306. Note that, in order to improve thermal conductance and/or improve cohesion, solder and/or thermal paste may be used between various components of system 300. For example, solder and/or thermal paste (not shown) may be used between flanges 313 and corresponding recesses 311. Solder and/or thermal paste (not shown) may be used between the bottom surface (as shown in FIG. 3) of PCB 303 and the top surface of top piece 309 of vapor chamber 304. Similarly, solder and/or thermal paste (not shown) may be used between the bottom surface of bottom piece 310 of vapor chamber 304 and the top surface of heat sink 305.

In one implementation, the three amplifier devices 302 and 301 are soldered (e.g., directly or reflowed) to the PCB 303, then the resulting assemblage is soldered to already assembled vapor chamber 304, and then that assemblage is screwed onto heat sink 305. If the already assembled vapor chamber 304 is attached to the first assemblage—i.e., PCB 303 and amplifier devices 302 and 301—using a solder reflow process, then special fixtures may be used in the reflow oven to ensure that the top piece 309 does not separate from the bottom piece 310 during the reflow process.

In another implementation, the vapor chamber 304 is attached to the PCB 303 with a first solder—e.g., in a first solder reflow process. Note that vapor chamber 304 may be assembled during this first solder reflow process or may be assembled beforehand. After the first solder reflow process, amplifier devices 301, amplifier device 302, and/or other components (not shown) are mounted onto PCB 303 of that assemblage using a second, low-temperature solder reflow process with a second, different, low-temperature—e.g., bismuth-based—solder. Note that the second solder reflow process includes soldering flanges 313 of amplifier devices 301 to the corresponding depressions 311 of vapor chamber 304. The use of the low-temperature solder helps protect the assembled vapor chamber 304 as it flows through the reflow process by reducing thermal stress on the vapor chamber 304 and helping prevent separation and/or leaks. This lower reflow processing temperature also helps protect the integrity of the solder and/or thermal paste connection that may be used between the bottom surface of PCB 303 and top piece 309, which may be at higher risk of damage due to increased thermal conductivity of vapor chamber 304.

In another implementation, the amplifier devices 302 and 301 are soldered to the PCB 303, then the resulting assemblage is soldered to unattached top piece 309, and then that assemblage is soldered to unattached bottom piece 310 to form an assemblage including assembled vapor chamber 304.

In yet another implementation, amplifier devices 301, amplifier device 302, PCB 303, and vapor chamber 304 are all substantially simultaneously attached together—possibly together with additional components (not shown)—in one solder reflow step using only one type of solder. Any of the above implementations may be combined with any suitable process—such as, for example, those described above—for evacuating the vapor chamber 304 of air and providing the vapor chamber 304 with its coolant. After the attachment of vapor chamber 304 to PCB 303, amplifier devices 301 and 302, and any other PCB-mounted components—as, for example, in any of the above-described implementations—that assemblage is attached to heat sink 305 using screws 306.

The localized heat generated inside RF power amplifier devices 301 gets quickly distributed over the volume of the vapor chamber 304 and spread over a larger surface. This rapid heat distribution reduces the overall flange temperature of the RF power amplifier devices 301 while improving the mean time before failure (MTBF) of the amplifier devices 301 and, consequently, the MTBF of the corresponding system 300 that includes the amplifiers 301. In general, improved heat dissipation also allows placement of multiple RF power amplifier devices closer to each other, thereby reducing the overall size, weight, and cost of the corresponding product.

Figure 4:
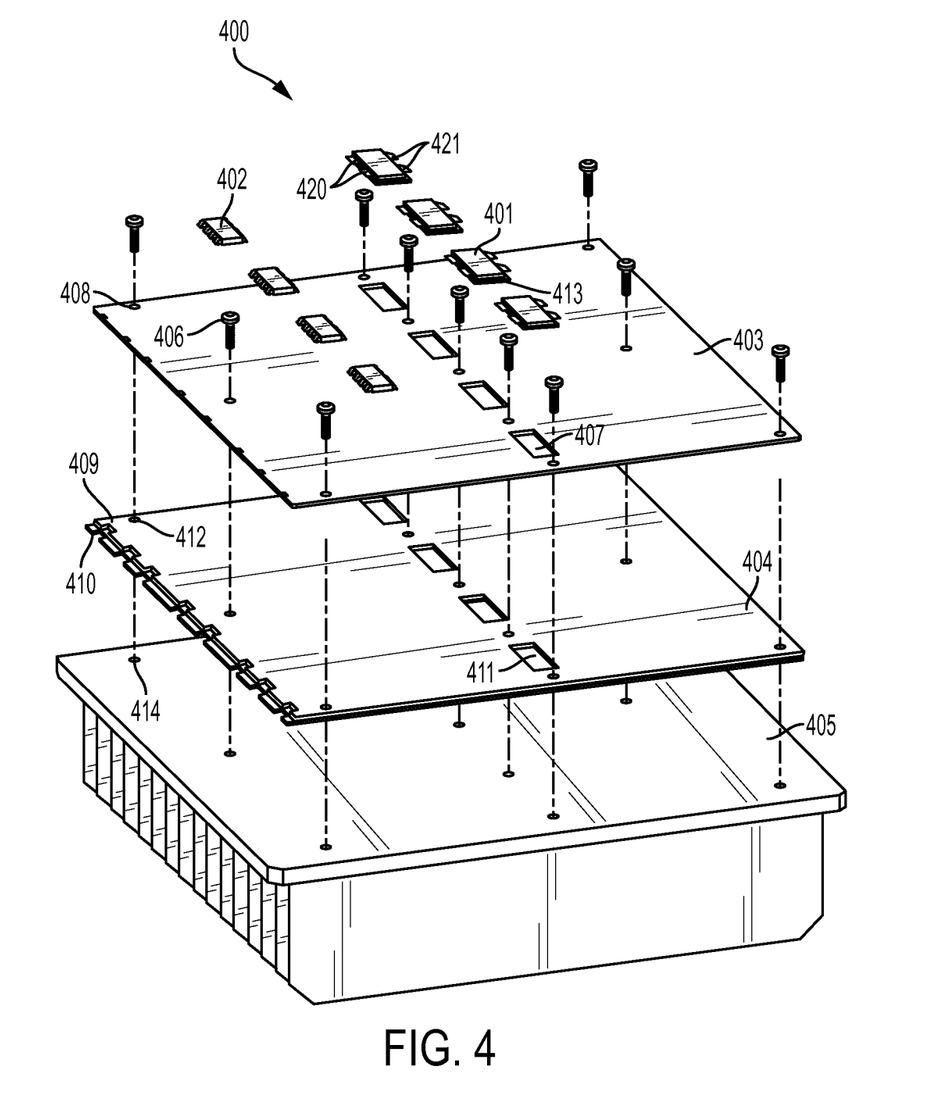
FIG. 4 is a simplified exploded perspective view of an exemplary vapor-chamber amplifier (VCA) system in accordance with another embodiment of the invention.

FIG. 4 is a simplified exploded perspective view of exemplary vapor-chamber amplifier (VCA) system 400 in accordance with another embodiment of the invention. Elements of VCA system 400 that are substantially similar to corresponding elements of VCA system 300 of FIG. 3 are similarly labeled, but with a different prefix.

VCA system 400 comprises four pre-final-stage RF power amplifier devices 402 and four final-stage RF power amplifier devices 401. Each final-stage RF power amplifier device 401 comprises one flange 413, two gate leads 420, and two drain leads 421 and functions substantially the same as RF power amplifier device 100 of FIGS. 1A-1D. PCB 403 has four corresponding apertures 407 for the four amplifier devices 401. Vapor chamber 404 has four corresponding depressions 411 for the four amplifier devices 401. The various elements of VCA system 400 may be attached together in any suitable manner, such as, for example, described above for the corresponding elements of VCA system 300. The power amplifier devices 401 are spaced relatively close together, where the distance separating adjacent amplifier devices 401 is less than the length of an amplifier device 401. This relatively close spacing is possible thanks to the improved heat dissipation from the use of vapor chamber 404.

Embodiments of the invention have been described where the fins of the power amplifier devices correspond to the gate and drain nodes of the contained transistor and the flange corresponds to the source of the transistor. The invention is not, however, so limited. In alternative embodiments, the external leads of the device may be organized in different ways. In other words, the nodes of the transistor within an amplifier device may be connected in a different manner to the external leads of the device.

Embodiments of the invention have been described where the final-stage RF power amplifier devices are packaged in LDMOS packages. The invention is not, however, so limited. In alternative embodiments different package types are used for the final-stage RF power amplifier devices. It should be noted that, in general, embodiments of the invention may have one or more power amplifiers devices—final-stage or not—where at least one power amplifier device is configured through an aperture in a PCB and into a recess in a vapor chamber.

Embodiments of the invention have been shown where VCA systems use screws to attach and hold together various components. The invention is not, however, so limited. Alternative embodiments attach and hold together a PCB, a vapor chamber, and a heat sink without the use of any screws for the attachment. Any suitable alternative attachment means may be used to hold together the various elements of a VCA system. For example, in one alternative embodiments, the various elements, including the heat sink, are held together with solder but without screws.

Embodiments of the invention have been described where a VCA system includes a conventional heat sink attached to the vapor chamber. The invention is not, however, so limited. In some alternative embodiments, the vapor chamber is attached to an element other than a conventional heat sink. In some other alternative embodiments, the bottom piece of the vapor chamber is not attached to anything but instead itself functions as a heat sink, radiating heat to its environment.

Embodiments of the invention have been described where the vapor chamber is formed by attaching together a top piece and a bottom piece. The invention is not, however, so limited. In alternative embodiments, the vapor chamber may be formed by any suitable process. For example, a vapor chamber may be assembled from more than two pieces. A vapor chamber may be assembled from pieces other than a top and bottom piece. For example, a vapor chamber may be assembled from a left and a right piece. A vapor chamber may be formed from a single piece that is molded, milled, or otherwise excavated to form the inner cavity, where the cavity is sealed after partial filling with the coolant and/or de-pressurization. In these alternative embodiments, the vapor chamber's top and bottom correspond, respectively, to the above-described top piece and bottom piece.

It should be noted that not every instance of plural elements—such as, for example, RF power amplifier devices, screws, and screw holes—is necessarily labeled in the figures; rather, in some cases, only exemplary instances are labeled. It should also be noted that, as used herein, the term apparatus may refer to a particular element—such as, for example, a vapor chamber—as well as a larger system incorporating that element—such as, for example, a VCA system.

Exemplary embodiments have been described wherein particular entities (a.k.a. modules) perform particular functions. However, the particular functions may be performed by any suitable entity and are not restricted to being performed by the particular entities named in the exemplary embodiments.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

We claim:

1. An apparatus comprising:
   a vapor chamber having a coolant-evaporating top stacked on a heat-releasing bottom and enclosing a sealed cavity that is partially filled with a coolant, wherein:
   the vapor chamber comprises a thermo-conductive material;
   a printed circuit board (PCB);
   the coolant-evaporating top of the vapor chamber has a vapor chamber depression formed therein; and
   the vapor chamber depression is adapted to receive and thereto-conductively connect to at least part of a bottom of a corresponding packaged semiconductor device mounted through a corresponding aperture in the PCB;
   the corresponding packaged semiconductor device mounted onto the PCB through the corresponding aperture in the PCB, wherein the vapor chamber depression receives and thermo-conductively connects to at least part of the bottom of the corresponding packaged semiconductor device; and
   wherein the PCB is attached to the coolant-evaporating top of the vapor chamber with a first solder that reflows at a first temperature; and
   the corresponding packaged semiconductor device is mounted onto the PCB and the vapor chamber depression using a second solder having a different composition than the first solder, wherein the second solder reflows at a second temperature lower than the first temperature.

2. The apparatus of claim 1, further comprising a heat sink thermo-conductively connected to the heat-releasing bottom of the vapor chamber.

3. The apparatus of claim 2, wherein:
   the PCB comprises a set of PCB holes;
   the vapor chamber comprises a set of vapor-chamber holes corresponding to the set of PCB holes;
   the heat sink comprises a set of tapped heat-sink holes corresponding to the set of PCB holes and the set of vapor-chamber holes; and a set of screws are inserted through the set of PCB holes and the set of vapor-chamber holes and screwed into the set of tapped heat-sink holes to hold together the PCB, the vapor chamber, and the heat sink.

4. The apparatus of claim 1, wherein the second solder is a bismuth-based alloy.

5. The apparatus of claim 1, wherein:
the packaged semiconductor device comprises a radio-frequency (RF) power amplifier device packaged in a laterally diffused metal oxide semiconductor (LDMOS) package with an earless flange;
the earless flange comprises the bottom of the packaged semiconductor device.

6. The apparatus of claim 1, further comprising a plurality of packaged semiconductor devices that includes the corresponding packaged semiconductor device, wherein:
each packaged semiconductor device of the plurality of packaged semiconductor devices is mounted through a corresponding aperture in the PCB; the coolant-evaporating top of the vapor chamber comprises a set of depressions formed therein corresponding to the plurality of packaged semiconductor devices;
the set of depressions comprising the vapor chamber depression; each depression of the set of depressions is adapted to receive and thermo-conductively connect to at least part of a bottom of a corresponding packaged semiconductor device of the plurality of packaged semiconductor devices; and
wherein the PCB comprises conductive traces interconnecting the plurality of packaged semiconductor devices.

7. The apparatus of claim 6, wherein:
the vapor chamber comprises an electrically conductive material; and
the vapor chamber serves as a common path for the plurality of packaged semiconductor devices.

8. The apparatus of claim 1, further comprising additional active components mounted on the PCB and electrically interconnected with the corresponding packaged semiconductor device via conductive traces of the PCB.

9. The apparatus of claim 1, wherein the vapor chamber depression is further adapted to thereto-conductively connect to at least part of a side of the corresponding packaged semiconductor device.

10. A method for assembling an apparatus, the method comprising:
mounting a packaged semiconductor device onto a printed circuit board (PCB); and
attaching the PCB to a vapor chamber, wherein:
the packaged semiconductor device comprises a bottom and is mounted through a corresponding aperture in the PCB;
the vapor chamber has a coolant-evaporating top stacked on a heat-releasing bottom and encloses a sealed, cavity that is partially filled with a coolant;
the vapor chamber comprises a thermo-conductive material;
the coolant-evaporating top of the vapor chamber has a vapor chamber depression formed therein that corresponds to the packaged semiconductor device; and
the vapor chamber depression is adapted to receive and thereto-conductively connect to at least part of the bottom of the packaged semiconductor device;
wherein attaching the PCB to the vapor chamber comprises:
solder reflowing a top piece that is part of the coolant-evaporating top of the vapor chamber to the PCB;
then attaching a bottom piece that is part of the heat-releasing bottom of the vapor chamber to the top piece to form a cavity of the vapor chamber;
then partially filling the cavity with the coolant; and
then sealing the cavity, resulting in the sealed cavity.

11. The method of claim 10, wherein the mounting and the attaching are performed simultaneously using only one type of solder.

12. A method for assembling an apparatus, comprising:
attaching a printed circuit board (PCB) to a vapor chamber using a first solder that reflows at a first temperature; and
mounting a packaged semiconductor device onto the printed circuit board using a second solder having a different composition than the first solder, wherein the second solder reflows at a second temperature that is lower than the first temperature, wherein the packaged semiconductor device comprises a bottom and, is mounted through a corresponding aperture in the PCB,
wherein the vapor chamber comprises a coolant-evaporating top stacked on a heat-releasing bottom and encloses a sealed cavity that is partially filled with coolant,
wherein the coolant-evaporating top of the vapor chamber has a vapor chamber depression therein that corresponds to the packaged semiconductor device, and
wherein mounting the packaged semiconductor device includes thermo-conductively connecting the vapor chamber depression to at least part of the bottom of the packaged semiconductor device.

13. The method of claim 12, wherein the second solder is a bismuth-based alloy.

14. The method of claim 12, wherein attaching the PCB to the vapor chamber further comprises, after attaching the bottom piece and before sealing the cavity, de-pressurizing the cavity.

* * * * *